United States Patent
Arakawa et al.

(10) Patent No.: US 8,215,753 B2
(45) Date of Patent: Jul. 10, 2012

(54) PIEZOELECTRIC MATERIAL, METHOD FOR PRODUCING PIEZOELECTRIC MATERIAL, PIEZOELECTRIC DEVICE AND LIQUID DISCHARGE DEVICE

(75) Inventors: Takami Arakawa, Kanagawa-ken (JP); Yuichi Okamoto, Kanagawa-ken (JP); Yoshikazu Hishinuma, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 352 days.

(21) Appl. No.: 12/698,792

(22) Filed: Feb. 2, 2010

(65) Prior Publication Data

US 2010/0194824 A1      Aug. 5, 2010

(30) Foreign Application Priority Data

Feb. 3, 2009  (JP) ................................. 2009-022392

(51) Int. Cl.
  *B41J 2/045*    (2006.01)
  *H01L 41/18*   (2006.01)
  *B32B 27/32*   (2006.01)
  *B32B 9/00*    (2006.01)
  *B32B 9/04*    (2006.01)

(52) U.S. Cl. ........................................................ 347/68

(58) Field of Classification Search ............ 252/62.9 PZ
  See application file for complete search history.

(56) References Cited

U.S. PATENT DOCUMENTS 7,048,360 B2   5/2006  Kanno et al.
7,348,715 B2   3/2008  Torii et al.

FOREIGN PATENT DOCUMENTS

EP            1973177 A2 *  9/2008
JP            2008-270704 A  11/2008
WO           WO-03/070641 A1  8/2003

OTHER PUBLICATIONS

H. Kanai et al., "Effect of Stoichiometry on the Dielectric Properties and Life Performance of (Pb0.875Ba0.125) [(Mg1/3Nb2/3)0.5 (Zn1/3Nb2/3)0.3 Ti0.2]O3 Relaxor Dielectric Ceramic: Part I, Dielectric Properties", J. Am. Ceram. Soc., vol. 76, No. 2, pp. 454-459, 1993.
H. Kanai et al., "Effect of Stoichiometry on the Dielectric Properties and Life Performance of (Pb0.875Ba0.125) [Mg1/3Nb2/3)0.5(Zn1/3Nb2/3)0.3Ti0.2]O3 Relaxor Dielectric Ceramic: Part II, Life Performance", J. Am. Ceram. Soc., vol. 76, No. 2, pp. 459-464, 1993.
T. Matsunaga et al., "Structural investigation of Pby(Zr0.57Ti0.43)2-yO3 films deposited on Pt(001)/MgO(001) substrates by rf sputtering", Physical Review B, vol. 66, 064102, pp. 064102-1-064102-8, 2002.
P. Muralt et al., "Excess Lead in the Perovskite Lattice of PZT Thin Films Made by In-Situ Reactive Sputtering", Integrated Ferroelectrics, vol. 36, pp. 53-62, 2001.
Japan Office Action dated Oct. 6, 2009 with English Translation.

* cited by examiner

*Primary Examiner* — Matthew Luu
*Assistant Examiner* — Lisa M Solomon
(74) *Attorney, Agent, or Firm* — Birch, Stewart, Kolasch & Birch, LLP.

(57) ABSTRACT

A piezoelectric material of the invention includes a perovskite oxide (P) (which may contain inevitable impurities) represented by the formula below:

$$Pb_a(Zr_x, Ti_y, M_{b-x-y})_b O_c \quad (P)$$

(wherein M represents one or two or more metal elements; wherein $0<x<b$, $0<y<b$, $0\leq b-x-y$; and wherein a molar ratio a:b:c is 1:1:3 as a standard; however, the molar ratio may be varied from the standard molar ratio within a range where a perovskite structure is obtained). The perovskite oxide (P) has a signal intensity ratio $I(Pb^{4+})/I(Pb^{2+})$ between $Pb^{4+}$ and $Pb^{2+}$ of more than 0 and less than 0.60 measured through XAFS.

17 Claims, 6 Drawing Sheets

PIEZOELECTRIC MATERIAL, METHOD FOR PRODUCING PIEZOELECTRIC MATERIAL, PIEZOELECTRIC DEVICE AND LIQUID DISCHARGE DEVICE

BACKGROUND OF THE INVENTION

1. Field of the Invention

The present invention relates to a PZT piezoelectric material, a method for producing the PZT piezoelectric material, as well as a piezoelectric device and a liquid discharge device employing the PZT piezoelectric material.

2. Description of the Related Art

Piezoelectric devices, which include a piezoelectric material that expands or contracts when the intensity of an applied electric field is increased or decreased, and an electrode for applying the electric field to the piezoelectric material, are used in applications, such as piezoelectric actuators provided in inkjet recording heads. As piezoelectric materials, PZT (lead zirconium titanate) and substitution systems of PZT, which has a part of the A-site and/or B-site thereof being substituted with a different element, have been known. PZT and the substitution systems thereof are herein collectively referred to as the "PZT system" or "PZT".

It has been known that PZT doped with a donor ion which has a higher valence than a valence of a substituted ion has higher piezoelectric performance than that of the intrinsic PZT. Examples of a donor ion that substitutes $Zr^{4+}$ and/or $Ti^{4+}$ at the B-site include $V^{5+}$, $Nb^{5+}$, $Ta^{5+}$, $Sb^{5+}$, $Mo^{6+}$ and $W^{6+}$. A PZT perovskite oxide with a part of the B-site thereof substituted with a different element M is represented by general formula (P) below:

$$Pb_a(Zr_x, Ti_y, M_{b-x-y})_b O_c \qquad (P)$$

(wherein M represents one or two or more B-site elements; wherein $0<x<b$, $0<y<b$, $0 \leq b-x-y$; and wherein a molar ratio a:b:c is 1:1:3 as a standard; however, the molar ratio may be varied from the standard molar ratio within a range where a perovskite structure is obtained.)

In applications such as inkjet recording heads, it is preferred that the piezoelectric material has a high piezoelectric constant, and a high piezoelectric performance of, for example, a piezoelectric constant $d_{31} \geq 150$ pm/V is required. Further, for the inkjet recording heads, it is preferred that the heads need to be replaced less often, and thus sufficient durability of the piezoelectric material for practical use is required.

In the PZT perovskite oxides, if a Pb content is low, the pyrochlore phase forms and this degrade the piezoelectric performance. It is therefore considered to be preferable to provide an A-site-rich composition, which has the Pb (i.e., an A-site element) content higher than a stoichiometric proportion. However, a higher Pb content tends to result in degradation of insulation resistance and durability.

A PZT dielectric body having high electric permittivity for use in a multilayer capacitor is disclosed in H. Kanai et al., "Effect of Stoichiometry on the Dielectric Properties and Life Performance of $(Pb_{0.875}Ba_{0.125})$ $[(Mg_{1/3}Nb_{2/3})_{0.5}(Zn_{1/3}Nb_{2/3})_{0.3} Ti_{0.2}]O_3$ Relaxor Dielectric Ceramic Part I, Dielectric Properties", J. Am. Ceram. Soc., Vol. 76, No. 2, pp. 454-458, 1993, and H. Kanai et al., "Effect of Stoichiometry on the Dielectric Properties and Life Performance of $(Pb_{0.875}Ba_{0.125})$ $[(Mg_{1/3}Nb_{2/3})_{0.5}(Zn_{1/3}Nb_{2/3})_{0.3} Ti_{0.2}]O_3$ Relaxor Dielectric Ceramic Part II, Life Performance", J. Am. Ceram. Soc., Vol. 76, No. 2, pp. 459-464, 1993. It is taught in these documents that an insufficient Pb content results in formation of the pyrochlore phase; however, the insulation resistance and the durability are improved, and both the high durability and high capacitance can be obtained. In the application as the dielectric body (where only high capacitance is required), the presence of the pyrochlore phase in some degree does not influence the performance of the dielectric body in use, and thus the presence of pyrochlore phase is not really a problem.

In the application as the piezoelectric material, however, even a trace of pyrochlore phase results in significant degradation of the piezoelectric performance. Therefore, a piezoelectric film which has a low Pb content and thus contains the pyrochlore phase is not applicable to practical use in the piezoelectric application.

U.S. Pat. No. 7,348,715 discloses (in claim 1) that, in the PZT system, improved durability can be provided when a molar ratio a/b between the A-site element and the B-site element is not less than 0.85 and less than 1.0. This document does not mention the pyrochlore phase. In this document, the film is formed through a usual gas phase film formation process (specifically, RF magnetron sputtering), and no measure is taken to prevent the formation of the pyrochlore phase. Thus, under the conditions described in the above document, where the Pb content is low, it is impossible to avoid the formation of the pyrochlore phase.

As described above, with respect to the PZT piezoelectric bodies, the piezoelectric performance and the durability are trade-off, and it has been impossible to provide both the high piezoelectric performance and high durability.

SUMMARY OF THE INVENTION

In view of the above-described circumstances, the present invention is directed to providing a PZT piezoelectric material with good durability, and a method for producing the PZT piezoelectric material.

The invention is further directed to providing a PZT piezoelectric material with good piezoelectric performance and good durability, and a method for producing the PZT piezoelectric material.

The piezoelectric material of the invention includes a perovskite oxide (P) (which may contain inevitable impurities) represented by the formula below:

$$Pb_a(Zr_x, Ti_y, M_{b-x-y})_b O_c \qquad (P)$$

(wherein M represents one or two or more metal elements; wherein $0<x<b$, $0<y<b$, $0 \leq b-x-y$; and wherein a molar ratio a:b:c is 1:1:3 as a standard; however, the molar ratio may be varied from the standard molar ratio within a range where a perovskite structure is obtained), the piezoelectric material having a signal intensity ratio $I(Pb^{4+})/I(Pb^{2+})$ between $Pb^{4+}$ and $Pb^{2+}$ of more than 0 and less than 0.60 measured through XAFS (X-ray absorption fine-structure spectroscopy).

The piezoelectric material of the invention may have a single-phase perovskite structure without a pyrochlore phase.

The absence of the pyrochlore phase is defined herein by that no diffraction peak of the pyrochlore phase is observed in usual XRD measurement.

The method for producing a piezoelectric film of the invention is to produce a piezoelectric film comprising a perovskite oxide (P) (which may contain inevitable impurities) represented by the formula below:

$$Pb_a(Zr_x, Ti_y, M_{b-x-y})_b O_c \qquad (P)$$

(wherein M represents one or two or more metal elements; wherein $0<x<b$, $0<y<b$, $0 \leq b-x-y$; and wherein a molar ratio a:b:c is 1:1:3 as a standard; however, the molar ratio may be varied from the standard molar ratio within a range where a perovskite structure is obtained), the method including sequentially carrying out a step (A) of carrying out film formation under conditions where a/b≧1.07 and a step (B) of carrying out film formation under conditions where a/b<1.07, wherein the piezoelectric film has a single-phase perovskite structure without a pyrochlore phase, and has a signal intensity ratio $I(Pb^{4+})/I(Pb^{2+})$ between $Pb^{4+}$ and $Pb^{2+}$ of more than 0 and less than 0.60 measured through XAFS (X-ray absorption fine-structure spectroscopy).

The piezoelectric device of the invention includes the above-described piezoelectric material of the invention, and an electrode for applying an electric field to the piezoelectric material.

The liquid discharge device of the invention includes the above-described piezoelectric device of the invention, and a liquid discharge member disposed adjacent to the piezoelectric device, the liquid discharge member including a liquid reservoir for storing a liquid, and a liquid discharge port for discharging the liquid from the liquid reservoir to the outside in response to application of the electric field to the piezoelectric material.

According to the invention, a PZT piezoelectric material with good durability and a method for producing the PZT piezoelectric material can be provided.

According to the invention, a PZT piezoelectric material with good durability in a high temperature and high humidity environment at a temperature of 40° C. and a relative humidity of 80% and a method for producing the PZT piezoelectric material can be provided.

According to the invention, a PZT piezoelectric material with good piezoelectric performance and good durability and a method for producing the PZT piezoelectric material can be provided.

DESCRIPTION OF THE PREFERRED EMBODIMENTS

Figure 1:
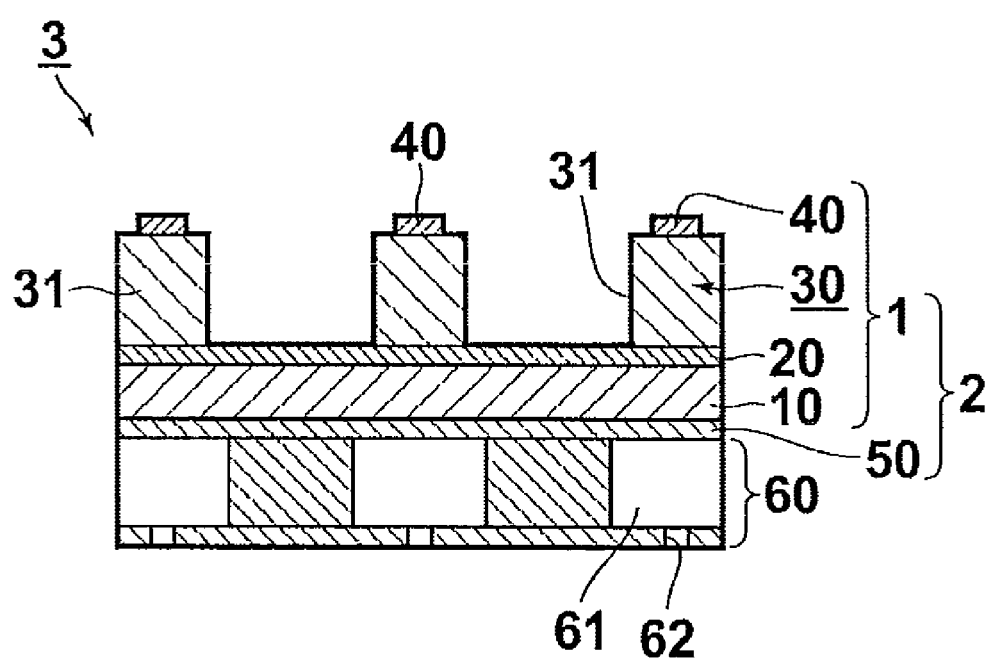
FIG. 1 is a sectional view illustrating the structure of a piezoelectric device and an inkjet recording head (liquid discharge device) according to one embodiment of the present invention.

With respect to PZT perovskite oxides, Pb has conventionally been considered to be divalent and be included at the A-site of the perovskite structure. Therefore, there has been no report of detailed analysis data of the valence of Pb in the PZT perovskite oxides.

As lead oxides, PbO, which is an oxide of divalent Pb, $Pb_3O_4$, which is an oxide of divalent Pb and tetravalent Pb, $PbO_2$, which is an oxide of tetravalent Pb, etc., are known, and it is known that the tetravalent Pb is metastable. However, the decomposition temperature of $Pb_3O_4$ is about 500° C., and the decomposition temperature of $PbO_2$ is about 290° C. Since the production temperature for the PZT perovskite oxides is usually higher than the decomposition temperature of the tetravalent Pb, it has been believed that the tetravalent Pb is not present in the perovskite oxides.

Recently, a hypothesis that the tetravalent Pb is present at the B-site has been presented in T. Matsunaga et al., "Structural investigation of $Pb_y(Zr_{0.57}Ti_{0.43})_{2-y}O_3$ films deposited on Pt(001)/MgO(001) substrates by rf sputtering", PHYSICAL REVIEW B, Vol. 66, 064102, pp. 064102-1-064102-8, 2002, and in P. Muralt et al., "EXCESS LEAD IN THE PEROVSKITE LATTICE OF PZT THIN FILMS MADE BY IN-SITU REACTIVE SPUTTERING", Integrated Ferroelectrics, Vol. 36, pp. 53-62, 2001.

The former document describes X-ray Rietveld analysis conducted on PZT films of non-MPB composition (Zr/Ti molar ratio=57/43, Pb/(Zr+Ti) molar ratio=1.07, 1.15, etc.), and states that it is structurally consistent if a tetravalent Pb is present at the B-site.

In the latter document, it is presumed that excessive Pb is included at the B-site as a tetravalent Pb since no segregation of PbO, or the like, is observed in TEM observation of a PZT film of non-MPB composition (Zr/Ti molar ratio=45/55, Pb/(Zr+Ti) molar ratio=1.30).

However, both of them are only presumptions. Further, both of them pertain to the PZTs of non-MPB composition, and do not report even presumption about the presence of the tetravalent Pb with respect to the MPB composition. Since the MPB composition has a complicated nano-structure, it is impossible to analyze the valence of Pb in PZT with the X-ray Rietveld analysis.

As described above, the presence of the tetravalent Pb in PZT has not conventionally been believed, and, even in the documents which mention the presence of the tetravalent Pb, it is only presumption. Under these circumstances, no research has been conducted about the relationship between the tetravalent Pb and properties of the piezoelectric material.

As shown in examples, which will be described later, the present inventors have proved the presence of the tetravalent Pb in the PZT perovskite oxides first in the world by conducting XAFS (X-ray absorption fine-structure spectroscopy). Further, the present inventors have found that a PZT piezoelectric material with good durability can be provided by making the amount of the tetravalent Pb within a certain range. The present inventors have found that a PZT piezoelectric material with good durability in a high temperature and high humidity environment at a temperature of 40° C. and a relative humidity of 80% can be provided by making the amount of the tetravalent Pb within a certain range. Furthermore, the present inventors have found that a PZT piezoelectric material with good piezoelectric performance and good durability and without containing the pyrochlore phase can be provided by devising a production method.

The piezoelectric material of the invention includes a perovskite oxide (which may contain inevitable impurities) represented by formula (P) below:

$$Pb_a(Zr_x,Ti_y,M_{b-x-y})_bO_c \quad (P)$$

(wherein M represents one or two or more metal elements; wherein 0<x<b, 0<y<b, 0≦b-x-y; and wherein a molar ratio a:b:c is 1:1:3 as a standard; however, the molar ratio may be varied from the standard molar ratio within a range where a perovskite structure is obtained), wherein a signal intensity ratio $I(Pb^{4+})/I(Pb^{2+})$ between $Pb^{4+}$ and $Pb^{2+}$ measured through XAFS (X-ray absorption fine-structure spectroscopy) is more than 0 and less than 0.60.

The perovskite oxide (P) is the intrinsic PZT or a PZT with a part of the B-site thereof substituted with M.

In the perovskite oxide (P), x and y are not particularly limited as long as the relationships $0<x<b$ and $0<y<b$ are satisfied.

It is said with respect to the PZT perovskite oxides that high piezoelectric performance is exhibited at and around the morphotropic phase boundary (MPB). When the PZT system is Zr-rich, a rhombohedral system is formed, when the PZT system is Ti-rich, a tetragonal system is formed, and the phase boundary between the rhombohedral system and the tetragonal system, i.e., the MPB, lies around Zr/Ti molar ratio=55/45.

Therefore, x and y of the perovskite oxide (P) may be or may be close to those of the MPB composition. Specifically, x/(x+y) may be not less than 0.40 and not more than 0.60, or may optionally be not less than 0.45 and not more than 0.55.

M, which is one or two or more substitution elements at the B-site, is not particularly limited.

It has been known that PZT doped with a donor ion which has a higher valence than a valence of a substituted ion has higher piezoelectric performance than that of the intrinsic PZT. M may be one or two or more donor ions having a valence higher than tetravalent Zr and/or Ti. Examples of such a donor ion include $V^{5+}$, $Nb^{5+}$, $Ta^{5+}$, $Sb^{5+}$, $Mo^{6+}$ and $W^{6+}$. That is, in the perovskite oxide (P), $0<b-x-y$, and M may be at least one element selected from the group consisting of V, Nb, Ta and Sb.

The value of b-x-y is not particularly limited as long as a perovskite structure is obtained. For example, if M is Nb, the molar ratio of Nb/(Zr+Ti+Nb) may be not less than 0.05 and not more than 0.25, or may optionally be not less than 0.05 and not more than 0.20.

The present inventors have found that the high durability can be provided when the ratio $I(Pb^{4+})/I(Pb^{2+})$ is more than 0 and less than 0.60. The present inventors have found that the high durability in a high temperature and high humidity environment at a temperature of 40° C. and a relative humidity of 80% can be provided when the ratio $I(Pb^{4+})/I(Pb^{2+})$ is more than 0 and less than 0.60. The ratio $I(Pb^{4+})/I(Pb^{2+})$ may be not less than 0.20 and less than 0.60, may optionally be not less than 0.20 and not more than 0.58, or may further optionally be not less than 0.28 and not more than 0.58.

The ratio $I(Pb^{4+})/I(Pb^{2+})$ is correlated with the ratio of the amounts of $Pb^{4+}$ and $Pb^{2+}$. Although it is not clearly supported, the present inventors believe that, since the tetravalent Pb is metastable and is less stable than the divalent Pb, the tetravalent Pb is easier to dissolve in water than the divalent Pb, and therefore, when the ratio of the tetravalent Pb increases, the durability in the high temperature and high humidity environment decreases.

The ion radius of $Pb^{2+}$ is 1.63 angstrom, and the ion radius of $Pb^{4+}$ is 0.915 angstrom. The "ion radius" herein is Shannon's ion radius. Although it is not clearly supported, it is presumed from the ion radius that the $Pb^{2+}$ is included at the A-site and the $Pb^{4+}$ is included at the B-site.

The ratio $I(Pb^{4+})/I(Pb^{2+})$ can be adjusted or controlled by controlling the production conditions, etc. In sputtering, for example, even when targets having the same composition are used, a total Pb content and the ratio $I(Pb^{4+})/I(Pb^{2+})$ can be changed by changing the substrate temperature (see examples, which will be described later). The present inventors have found that, when the total Pb content in the perovskite oxide increases, the ratio of $Pb^{4+}$ tends to increase.

The piezoelectric material may take any form, such as a single crystal, a bulk ceramic or a film. Considering providing thinner and smaller piezoelectric devices and productivity, etc., the piezoelectric material may take the form of a film, and may be a thin film with the thickness of not less than 500 nm and not more than 10 μm.

As has been described previously in the "Description of the Related Art" section, in conventional usual film formation methods, decrease of the Pb content tends to result in formation of the pyrochlore phase.

It is believed that, during formation of the perovskite phase, the reaction progresses through the pyrochlore phase. Various reaction paths have been proposed for formation of PZT, and for example, it is believed that the reaction progresses through the following two stages. The reaction formula of the PZT system below is written by the present inventors based on a known reaction formula of a relaxor system.

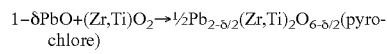
$$1-\delta PbO+(Zr,Ti)O_2 \to \tfrac{1}{2}Pb_{2-\delta/2}(Zr,Ti)_2O_{6-\delta/2}(\text{pyrochlore})$$

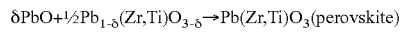
$$\delta PbO+\tfrac{1}{2}Pb_{1-\delta}(Zr,Ti)O_{3-\delta}\to Pb(Zr,Ti)O_3(\text{perovskite})$$

It is believed that, when Pb is insufficient, or the temperature is insufficient and thus the activation energy is insufficient, the reaction stops at the first stage, and thus the pyrochlore phase tends to form. In a case of a bulk ceramic, sintering is carried out at a high temperature of 1000° C. or more (1200° C., for example). Therefore, it is believed that sufficient activation energy can be provided for the second stage reaction even under the condition of a relatively low Pb content, and thus a PZT piezoelectric material without the pyrochlore phase can be produced. Also, it is believed that, in a case of screen printing, since the similar high temperature sintering is carried out, PZT piezoelectric material without the pyrochlore phase can be produced.

In general, in gas phase processes, a film is formed at a temperature lower than that for producing a bulk ceramic, and thus the pyrochlore phase forms if the Pb content is low.

For example, when a silicon substrate, a silicon oxide substrate or a silicon-containing substrate, such as a SOI substrate is used, lead glass is formed through a reaction between Pb and Si at a high temperature of 800° C. or more, and the substrate becomes brittle. Therefore, it is necessary to carry out the film formation at a relatively low temperature of less than 800° C.

In gas phase processes such as sputtering and plasma CVD using plasma, Pb is susceptible to a reverse sputtering phenomenon, and therefore the Pb content tends to be insufficient. In order to minimize the reverse sputtering of Pb, it is considered to be preferable to set a film formation temperature as low as possible (for example, not more than 600° C.), and this may often result in insufficient activation energy. If the film formation temperature is raised to promote the reaction, the degree of the reverse sputtering of Pb is increased, and the insufficiency of Pb becomes more pronounced. In such film formation, it is considered to be effective to provide an excessive amount of PbO to shift the reaction equilibrium rightward.

By devising a production method, the present inventors have accomplished a piezoelectric film having a single-phase perovskite structure without the pyrochlore phase even under conditions where the total Pb content is low and the amount of $Pb^{4+}$ is low.

The method for producing a piezoelectric film according to the invention is to produce a piezoelectric film comprising a perovskite oxide (P) (which may contain inevitable impurities) represented by the formula below:

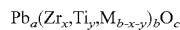
$$Pb_a(Zr_xTi_yM_{b-x-y})_bO_c \tag{P}$$

(wherein M represents one or two or more metal elements; wherein $0<x<b$, $0<y<b$, $0\leqq b-x-y$; and wherein a molar ratio a:b:c is 1:1:3 as a standard; however, the molar ratio may be varied from the standard molar ratio within a range where a perovskite structure is obtained), the method including sequentially carrying out a step (A) of carrying out film formation under conditions where $a/b\geqq1.07$, and a step (B) of carrying out film formation under conditions where $a/b<1.07$ to produce the piezoelectric film which has a single-phase perovskite structure without a pyrochlore phase, and has a signal intensity ratio $I(Pb^{4+})/I(Pb^{2+})$ between $Pb^{4+}$ and $Pb^{2+}$ of more than 0 and less than 0.60 measured through XAFS (X-ray absorption fine-structure spectroscopy).

During the earlier stage of the film formation of the piezoelectric film, the film formation is carried out under the conditions where $a/b\geqq1.07$, where no pyrochlore phase forms and a single-phase perovskite structure is stably obtained, to grow a film having good perovskite crystallinity (step (A)). Thereafter, the film is grown under the conditions where $a/b<1.07$, where the pyrochlore phase tends to form (step (B)). In this method, the film having good perovskite crystallinity is grown first, and this film serves as a crystal nucleus. Therefore, even when the film is subsequently grown under the conditions where $a/b<1.07$, where the pyrochlore phase tends to form, the film having a single-phase perovskite structure with good crystallinity and without the pyrochlore phase can be grown. The film composition is distributed in the thickness direction; however $a/b\leqq1.06$ for the entire film. The layer of the film formed in step (A) is referred to herein as an "initial layer" and the layer of the film formed in step (B) is referred to herein as a "main layer".

The process used in the film formation is not particularly limited, and examples thereof include gas phase processes such as sputtering, plasma CVD, MOCVD and PLD; liquid phase processes such as sol-gel method and organic metal decomposition method; and aerosol deposition process. In view of ease of changing the film formation conditions (since the ratio a/b is changed during the film formation), the gas phase processes, such as sputtering, plasma CVD, MOCVD and PLD, may be preferred.

In the gas phase processes, the ratio a/b can be adjusted by changing one or two or more factors involved in the film formation, such as the film formation temperature and the film formation pressure.

For example, the sputtering is a film formation method in which a substrate and a target are disposed to face each other, and a gas which is plasmized under reduced pressure is made to collide against the target, so that the energy of the collision makes molecules or atoms be ejected from the target and deposited on the substrate. In the sputtering, the ratio a/b can be adjusted by changing one or two or more factors involved in the film formation, such as the target composition, the film formation temperature, the substrate surface energy, the film formation pressure, the amount of oxygen in the atmosphere gas, the plasma potential and the substrate-target distance.

For example, the ratio a/b can easily be changed by changing the film formation temperature during the film formation. In this case, in step (A), the film formation is carried out at a relatively low temperature where $a/b\geqq1.07$ is achieved, and in step (B), the film formation is carried out at a relatively high temperature where $a/b<1.07$ is achieved. The temperature conditions to achieve $a/b\geqq1.07$ or $a/b<1.07$ depend on film formation conditions other than the film formation temperature, such as the film composition and the film formation device used.

The film thickness of the initial layer formed in step (A) is not particularly limited, as long as the formed initial layer is even and has good perovskite crystallinity, and can serve as the crystal nucleus when the film formation condition is changed to achieve $a/b<1.07$.

The present inventors have found that, if the film thickness of the film formed in step (A) is too thin, such as around 10 nm, the film formed in step (A) does not sufficiently serve as the crystal nucleus (see Japanese Patent Application No. 2008-249620, which had not been published when the Japanese patent application from which this application claims priority was filed). The film thickness of the initial layer formed in step (A) may be 30 nm or more, or optionally be 100 nm or more.

Since the purpose is to obtain the main layer, an unnecessarily thick initial layer only increases the process time. In addition, if the initial layer is excessively thick, the high Pb concentration across the entire film exerts nonnegligible influence on the durability of the initial layer, and the durability of the film may be degraded. The film thickness of the initial layer formed in step (A) may be not more than 1.0 μm, or optionally not more than 300 nm.

The production method of the invention is particularly effective for a relatively low temperature process carried out at a temperature of less than 800° C., which conventionally has not been able to provide a single-phase perovskite structure under the low Pb content condition. That is, the invention is effective for the gas phase processes, in particular, sputtering and plasma CVD using plasma. The invention is effective when the substrate is a silicon substrate, a silicon oxide substrate or a silicon-containing substrate, such as a SOI substrate.

According to the invention, under the conditions where the temperature is 40° C. and the relative humidity is 80%, a PZT piezoelectric material having an average life of 50 billion cycles or more, which is measured under the following measurement conditions, can be provided. According to the invention, a PZT piezoelectric material having an average life of 70 billion cycles or more measured under the same measurement conditions can be provided (see Tables 1 and 2 below). It should be noted that the following measurement conditions are very harsh conditions, and the invention can provide the PZT piezoelectric material which has a long life even under such conditions. Thus, the PZT piezoelectric material according to the invention has even longer life under actual service conditions.

Measurement Conditions for Measuring Average Life

The piezoelectric constant $d_{31}$ of the piezoelectric film in the form of a piezoelectric device, which has a lower electrode formed on the side of the piezoelectric film nearer to the substrate and a number of upper electrodes formed on the side of the piezoelectric film opposite from the substrate, is measured. The upper electrodes have a layered structure of a 20 nm-thick Ti film and a 150 nm-thick Pt film formed in this order from the piezoelectric film side, and an area of each upper electrode is 0.6 mm$^2$.

The piezoelectric constant $d_{31}$ measured under a sinusoidal voltage with an offset of 10 V, an amplitude of ±10 V and a frequency of 1 kHz is defined as $d_{31}(+)$. The piezoelectric constant $d_{31}$ measured under a sinusoidal voltage with an offset of −10 V, an amplitude of ±10V and a frequency of 1 kHz is defined as $d_{31}(-)$.

Figure 6:
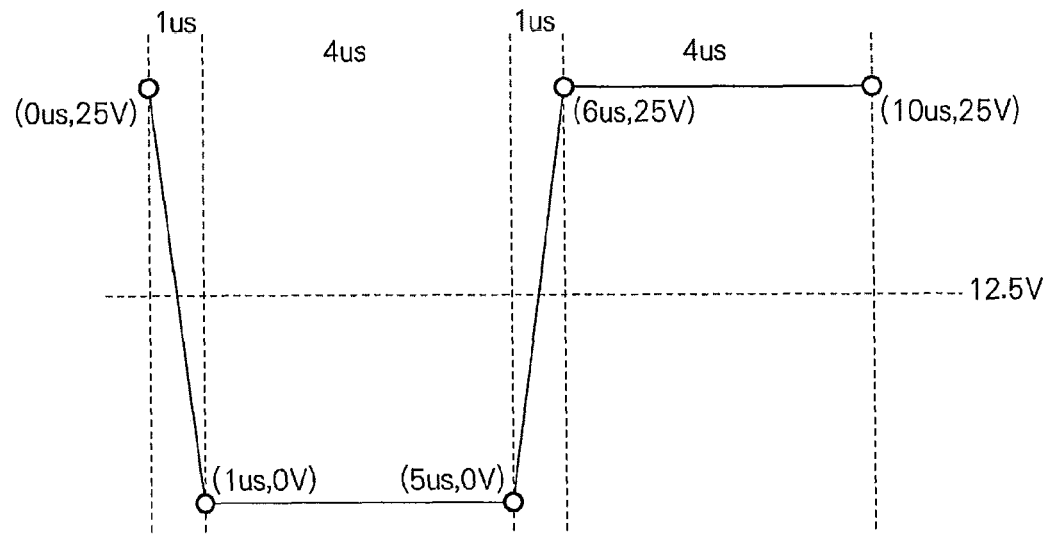
FIG. 6 is a diagram illustrating drive waveforms used in average life measurement.
Figure 6:
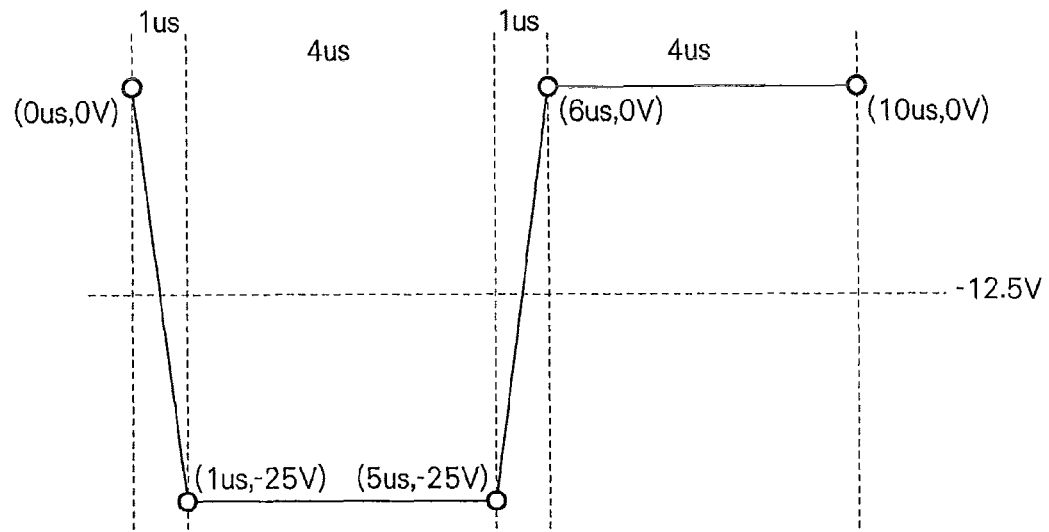

When $d_{31}(+)\geqq d_{31}(-)$, a 100 kHz trapezoidal wave of 12.5 V±12.5 V is applied (see the upper part of FIG. 6). When $d_{31}(-)>d_{31}(+)$, a 100 kHz trapezoidal wave of −12.5 V±12.5 V is applied (see the lower part of FIG. 6). In both cases, application of voltage is stopped every 1 billion cycles (i.e., 100 kHz×1 billion cycles=16.7 minutes), and tan δ for 1 V, 1 kHz is measured with a LCR meter. Points at which the tan δ exceeds 0.1 are found as life values. Then, an average of the measured life values of randomly selected 20 upper electrodes among the number of upper electrodes on the piezoelectric film are calculated as the average life.

According to the invention, a PZT piezoelectric material having the piezoelectric constant $d_{31}$ of 150 pm/V or more can be provided (see Tables 1 and 2 below).

The "piezoelectric constant $d_{31}$ of 150 pm/V or more" herein means that at least one of the $d_{31}$ (+) and $d_{31}$(−) defined above is 150 pm/V or more.

As described above, according to the invention, the PZT piezoelectric material with good durability and the method for producing the PZT piezoelectric material can be provided.

According to the invention, the PZT piezoelectric material with good durability in a high temperature and high humidity environment at a temperature of 40° C. and a relative humidity of 80% and the method for producing the PZT piezoelectric material can be provided.

According to the invention, the PZT piezoelectric material with good piezoelectric performance and good durability and the method for producing the PZT piezoelectric material can be provided.

Piezoelectric Device and Inkjet Recording Head

The structures of a piezoelectric device and an inkjet recording head (liquid discharge device) including the piezoelectric device according to one embodiment of the invention are described with reference to FIG. 1. FIG. 1 is a sectional view illustrating the main portion of the inkjet recording head (a sectional view taken along the thickness direction of the piezoelectric device). For ease of visual understanding, the components shown in the drawing are not to scale.

A piezoelectric device 1 of this embodiment includes a substrate 10, and a lower electrode 20, a piezoelectric film 30 and upper electrodes 40 which are sequentially formed on the substrate 10. An electric field in the thickness direction is applied to the piezoelectric film 30 via the lower electrode 20 and the upper electrodes 40.

The lower electrode 20 is formed over substantially the entire surface of the substrate 10. The piezoelectric film 30, which is formed by line-shaped protrusions 31 arranged in stripes pattern is formed on the lower electrode 20, and the upper electrodes 40 are formed on the individual protrusions 31.

The pattern of the piezoelectric film 30 is not limited to one shown in the drawing, and may be designed as appropriate. Alternatively, the piezoelectric film 30 may be a continuous film. However, when the piezoelectric film 30 is not a continuous film and has the pattern including the plurality of separate protrusions 31, the individual protrusions 31 can smoothly expand or contract, thereby providing larger displacement.

The substrate 10 is not particularly limited, and may be any of various substrates, such as silicon, silicon oxide, stainless steel (SUS), yttrium stabilized zirconia (YSZ), alumina, sapphire, SiC, and $SrTiO_3$. The substrate 10 may be a multilayer substrate, such as a SOI substrate including a $SiO_2$ film and a Si active layer formed on a silicon substrate. The invention is particularly effective in a case where any of a silicon, silicon oxide, or SOI substrate is used.

The composition of the lower electrode 20 is not particularly limited, and examples thereof may include a metal or a metal oxide, such as Au, Pt, Ir, $IrO_2$, $RuO_2$, $LaNiO_3$, and $SrRuO_3$, as well as combinations thereof. The composition of the upper electrodes 40 is not particularly limited, and examples thereof may include the example materials listed for the lower electrode 20, electrode materials commonly used in semiconductor processes, such as Al, Ta, Cr and Cu, and combinations thereof. The thicknesses of the lower electrode 20 and the upper electrodes 40 are not particularly limited; however, their thicknesses may be in the range from 50 to 500 nm.

The piezoelectric film 30 is formed of the perovskite oxide (P) (which may contain inevitable impurities), which is the piezoelectric film of the invention having the signal intensity ratio $I(Pb^{4+})/I(Pb^{2+})$ between $Pb^{4+}$ and $Pb^{2+}$ of more than 0 and less than 0.60 measured through XAFS. The film thickness of the piezoelectric film 30 is not particularly limited, and may be in the range from 500 μm to 10 μm, for example.

A piezoelectric actuator 2 includes a vibrating plate 50, which vibrates along with expansion and contraction of the piezoelectric film 30, attached on the back side of the substrate 10 of the piezoelectric device 1. The piezoelectric actuator 2 also includes a controlling means (not shown), such as a driving circuit, for controlling drive of the piezoelectric device 1.

An inkjet recording head (liquid discharge device) 3 generally includes, at the back side of the piezoelectric actuator 2, an ink nozzle (liquid storing and discharging member) 60 including an ink chamber (liquid reservoir) 61 for storing ink and an ink discharge port (liquid discharge port) 62 through which the ink is discharged from the ink chamber 61 to the outside. There are a plurality of ink chambers 61 provided correspondingly to the number and pattern of the protrusions 31 of the piezoelectric film 30. In the inkjet recording head 3, the piezoelectric device 1 expands or contracts when the intensity of the electric field applied to the piezoelectric device 1 is increased or decreased, thereby controlling discharge of the ink from the ink chamber 61 and the amount of the discharged ink.

Instead of attaching the vibrating plate 50 and the ink nozzle 60 which are members separate from the substrate 10, parts of the substrate 10 may be machined to form the vibrating plate 50 and the ink nozzle 60. For example, if the substrate 10 is a multilayer substrate, such as a SOI substrate, the substrate 10 may be etched at the back side thereof to form the ink chamber 61, and then the substrate may be machined to form the vibrating plate 50 and the ink nozzle 60.

The structures of the piezoelectric device 1 and the inkjet recording head 3 of this embodiment are as described above. According to this embodiment, the piezoelectric device 1 with good durability can be provided. According to this embodiment, the piezoelectric device 1 with good piezoelectric performance and good durability can be provided.

Inkjet Recording Device

Figure 2:
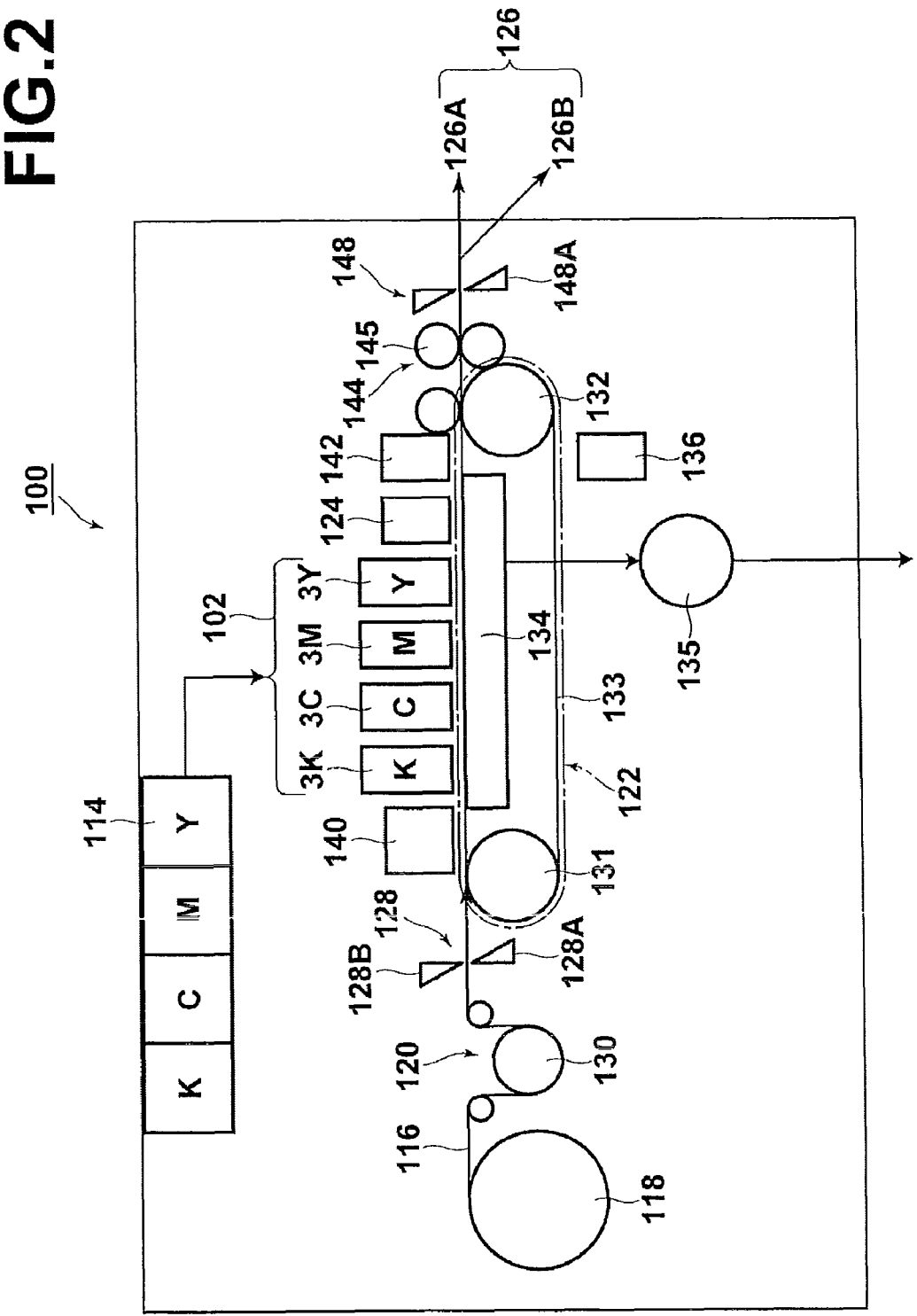
FIG. 2 is a diagram illustrating the configuration example of an inkjet recording device including the inkjet recording head of FIG. 1.
Figure 3:
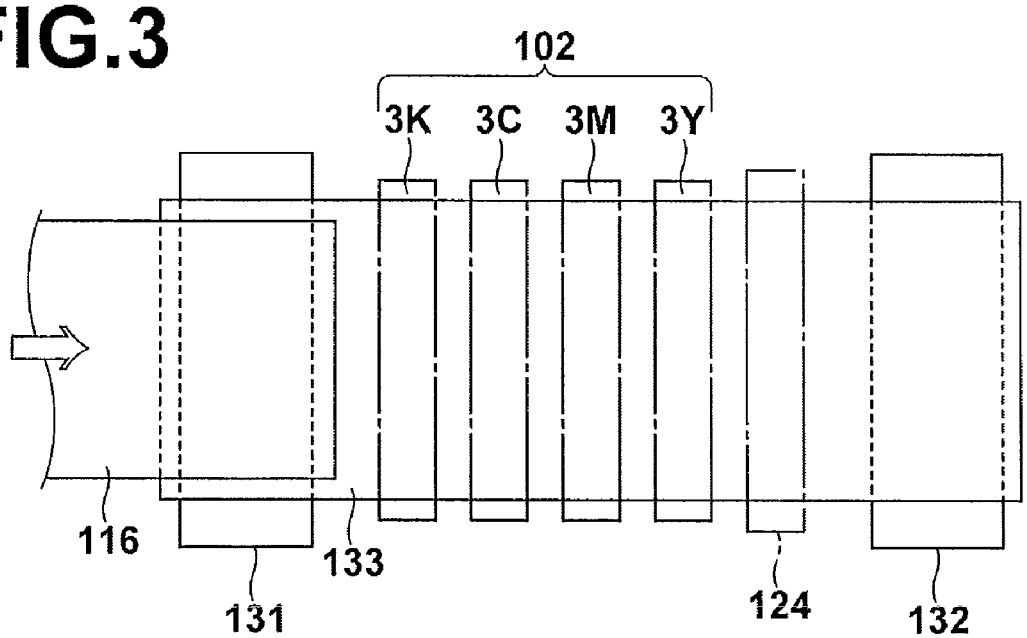
FIG. 3 is a partial plan view of the inkjet recording device of FIG. 2.

Now, an example configuration of an inkjet recording device including the inkjet recording head 3 of the above-described embodiment is described with reference to FIGS. 2 and 3. FIG. 2 shows the entire device configuration, and FIG. 3 is a partial plan view of the device.

An inkjet recording device 100 shown in the drawing generally includes: a printing section 102 having a plurality of inkjet recording heads (hereinafter simply referred to as "heads") 3K, 3C, 3M and 3Y provided correspondingly to ink colors; an ink storing and charging section 114 for storing inks to be fed to the heads 3K, 3C, 3M and 3Y; a paper feeding section 118 for feeding recording paper 116; a decurling section 120 for decurling the recording paper 116; a suction belt conveyer section 122 disposed to face to a nozzle surface (ink discharge surface) of the printing section 102, for conveying the recording paper 116 with keeping the flatness of the recording paper 116; a print detection section 124 for reading the result of printing at the printing section 102; and a paper discharge section 126 for discharging the printed recording paper (a print) to the outside.

Each of the heads 3K, 3C, 3M and 3Y forming the printing section 102 is the inkjet recording head 3 of the above-described embodiment.

At the decurling section 120, the recording paper 116 is decurled with a heating drum 130 heating the recording paper 116 in a direction opposite to the direction of the curl.

In the device using the roll paper, a cutter 128 is provided downstream the decurling section 120, as shown in FIG. 2, so that the roll paper is cut by the cutter into a sheet of a desired size. The cutter 128 is formed by a fixed blade 128A, which has a length equal to or larger than the width of the conveyance path for the recording paper 116, and a round blade 128B, which moves along the fixed blade 128A. The fixed blade 128A is disposed on the back surface side of the print, and the round blade 128B is disposed on the print surface side via the conveyance path. In a case where the device uses cut sheets, the cutter 128 is not necessary.

The decurled and cut recording paper sheet 116 is sent to the suction belt conveyer section 122. The suction belt conveyer section 122 includes an endless belt 133 wrapped around rollers 131 and 132, and is adapted such that at least an area of the belt facing the nozzle surface of the printing section 102 and a sensor surface of the print detection section 124 forms a horizontal (flat) surface.

The belt 133 has a width that is larger than the width of the recording paper sheet 116, and a number of suction holes (not shown) are formed in the belt surface. A suction chamber 134 is provided on the inner side of the belt 133 wrapped around the rollers 131 and 132 at a position where the suction chamber 134 faces to the nozzle surface of the printing section 102 and the sensor surface of the print detection section 124. A suction force generated by a fan 135 provides the suction chamber 134 with a negative pressure, thereby suctioning and holding the recording paper sheet 116 on the belt 133.

As a motive force from a motor (not shown) is transmitted to at least one of the rollers 131 and 132, around which the belt 133 is wrapped, the belt 133 is driven in the clockwise direction in FIG. 2, and the recording paper sheet 116 held on the belt 133 is conveyed from the left to the right in FIG. 2.

In a case where margin-less printing, or the like, is carried out, the inks adhere on the belt 133. Therefore, a belt cleaning section 136 is provided at a predetermined position (any appropriate position other than the print region) on the outer side of the belt 133.

A heating fan 140 is provided upstream the printing section 102 along the paper sheet conveyance path formed by the suction belt conveyer section 122. The heating fan 140 blows heating air onto the recording paper sheet 116 to heat the recording paper sheet 116 before printing. Heating the recording paper sheet 116 immediately before printing promotes drying of the deposited ink.

The printing section 102 is a so-called full-line head, in which line heads, each having a length corresponding to the maximum paper width, are arranged in a direction (main scanning direction) perpendicular to the paper feed direction (see FIG. 3). Each recording head 3K, 3C, 3M, 3Y is formed by a line head, which has a plurality of ink discharge orifices (nozzles) provided across a length that is larger than at least one side of the recording paper sheet 116 of the maximum size printable by the inkjet recording device 100.

The heads 3K, 3C, 3M and 3Y respectively corresponding to the color inks of black (K), cyan (C), magenta (M) and yellow (Y) are disposed in this order from the upstream along the feed direction of the recording paper sheet 116. By discharging the color inks from the heads 3K, 3C, 3M and 3Y while the recording paper sheet 116 is conveyed, a color image is recorded on the recording paper sheet 116.

The print detection section 124 is formed by a line sensor, or the like, which images the result of ink droplets deposited by the printing section 102, and the image of the deposited ink droplets read by the line sensor is used to detect discharge defects, such as clogging of the nozzles.

A drying section 142 formed, for example, by a heating fan for drying the printed image surface is disposed downstream the print detection section 124. Since contact with the printed surface should be avoided until the printed inks dry, blowing hot air may be preferred.

A heating and pressurizing section 144 for controlling the gloss of the image surface is disposed downstream the drying section 142. The heating and pressurizing section 144 presses the image surface with a pressure roller 145 having a predetermined textured pattern on the surface thereof while heating the image surface, thereby transferring the textured pattern onto the image surface.

The thus obtained print is discharged at the paper discharge section 126. Prints of intended images (prints on which intended images are printed) and test prints may separately be discharged. The inkjet recording device 100 includes a sorting means (not shown) for sorting the prints of intended images and the test prints and switching the discharge paths to selectively send them to a discharge section 126A or 126B.

In a case where an intended image and a test print are printed at the same time on a large-sized paper sheet, a cutter 148 may be provided to cut off the test print area.

The configuration of the inkjet recording device 100 is as described above.

Modification

The present invention is not limited to the above-described embodiments, and may be modified as appropriate without departing from the spirit and scope of the invention.

EXAMPLES

Now, examples according to the invention and a comparative example are described.

Example 1

A 20 nm-thick Ti film and a 150 nm-thick (111) Ir film forming the lower electrode were sequentially formed on a Si wafer through sputtering. Then, a Nb-PZT piezoelectric film was formed on the lower electrode. During the film formation of the Nb-PZT piezoelectric film, the initial layer with a thickness of 150 nm was formed at a substrate temperature of 420° C., and then, the substrate temperature was changed to 450° C. to form the main layer. In the device used in this example, it took about 10 minutes for the substrate temperature to actually reach the set temperature after the set temperature was changed. The total thickness of the Nb-PZT piezoelectric film was 4 μm. The temperature conditions for forming the piezoelectric film are shown in Table 1.

Other film formation conditions for forming the piezoelectric film were as follows:

film formation device: a RF sputtering apparatus (FERROELECTRIC FILM FORMATION SPUTTERING APPARATUS, type MPS, available from ULVAK, Inc.), target: $Pb_{1.3}((Zr_{0.52}Ti_{0.48})_{0.88}Nb_{0.12})O_3$ sintered body with a diameter of 120 mm, film formation power: 500 W, substrate-target distance: 60 mm, film formation pressure: 0.3 Pa, and film formation gas: $Ar/O_2$=97.5/2.5 (molar ratio).

Finally, Ti/Pt upper electrodes (Ti: 20 nm-thick/Pt: 150 nm-thick) were formed on the PZT film through vapor deposition (the Ti layer serves as an adhesion layer and the Pt layer mainly serves as the electrode) to provide the piezoelectric device of the invention.

Examples 2 to 3, Comparative Example 1

Piezoelectric devices were provided similarly to example 1 except that the film formation temperature conditions for forming the piezoelectric film were changed as shown in Table 1. In comparative example 1, the film formation was carried out without changing the film formation temperature for forming the piezoelectric film.

The composition was the MPB composition in all examples 2 to 3 and comparative example 1, and only the film formation temperature conditions for forming the piezoelectric film were changed to form films having different $I(Pb^{4+})/I(Pb^{2+})$ ratios.

Evaluation

<XRD>

XRD analysis using the θ/2θ measurement method was conducted on the piezoelectric films of examples 1 to 3 and comparative example 1, using an X-ray diffractometer ULTIMA for thin film evaluation, available from Rigaku, Co., Ltd.

Figure 4:
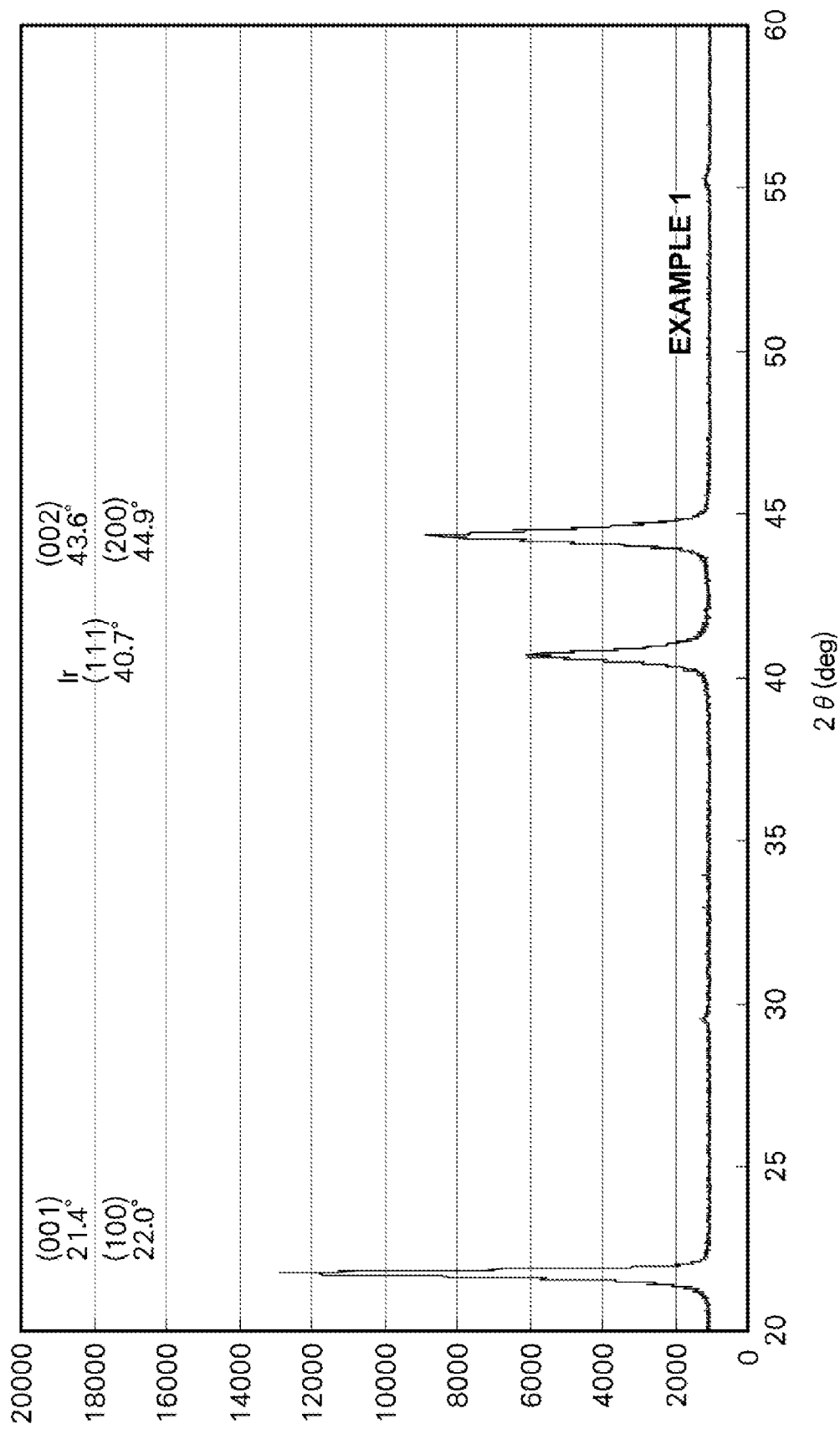
FIG. 4 is a graph showing an XRD pattern of a piezoelectric film of example 1.

In all the examples, the resulting piezoelectric film was a (100)-oriented film having a perovskite structure. The degree of orientation F measured with the Lotgerling method was 99%. No peaks of different phases, such as the pyrochlore phase and PbO were observed, and thus the resulting piezoelectric films had a single-phase perovskite structure with good crystallinity. As a representative example, an XRD pattern of example 1 is shown in FIG. 4.

<XRF>

X-ray fluorescence (XRF) measurement was conducted on the piezoelectric films of examples 1 to 3 and comparative example 1, using an X-ray fluorescence device AXIOS, available from PANalytical, to measure the a/b ratio (=Pb/(Zr+Ti+Nb) molar ratio). The results are shown in Table 1.

<XAFS>

Figure 5:
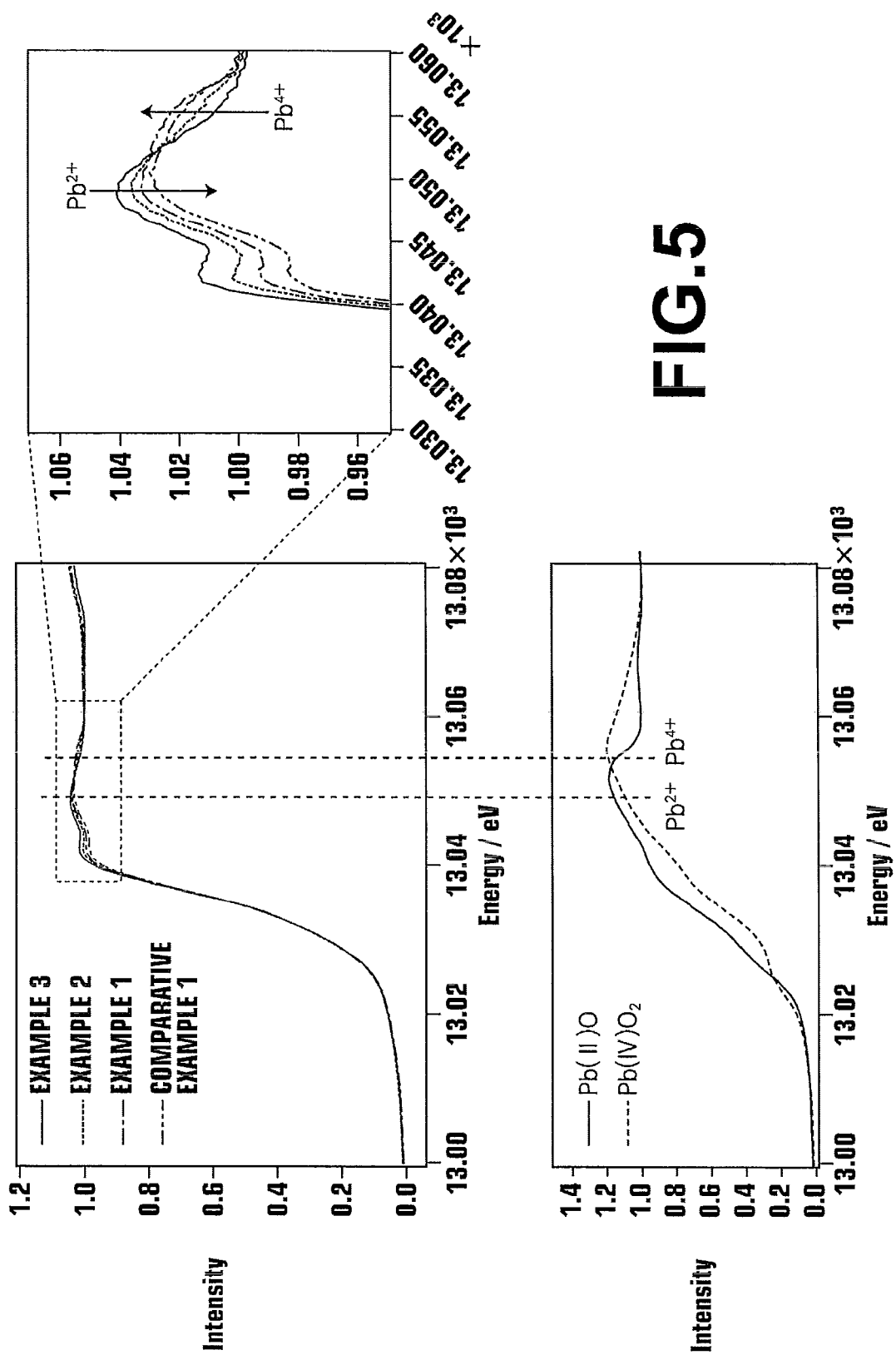
FIG. 5 is a graph showing XANES spectra of examples 1 to 3 and comparative example 1.

XAFS measurement was conducted on the piezoelectric films of examples 1 to 3 and comparative example 1, using the Spring-8, a synchrotron radiation facility, and at the High Energy Accelerator Research Organization. XANES spectra around the Pb L3 absorption edge are shown in FIG. 5.

Based on comparison with standard samples (Pb (II) O, Pb (IV)O₂) peaks observed at 13048 eV were determined as being derived from $Pb^{2+}$, and peaks observed at 13055 eV were determined as being derived from $Pb^{4+}$. The peak intensities $I(Pb^{2+})$ and $I(Pb^{4+})$ were found through fitting using a Gaussian function to calculate the ratio $I(Pb^{4+})/I(Pb^{2+})$. The results are shown in Table 1.

<Durability>

Measurement of the piezoelectric constants $d_{31}(+)$ and $d_{31}(-)$ and measurement of the average life under the conditions of a temperature of 40° C. and a relative humidity of 80% were conducted on the piezoelectric devices of examples 1 to 3 and comparative example 1. The results are shown in Table 2. The Nb-PZT films provided in examples 1 to 3, in which the ratio $I(Pb^{4+})/I(Pb^{2+})$ was less than 0.6, had high piezoelectric performance and high durability.

TABLE 1

| | Film Formation Temperature for Initial Layer (Thickness of Initial Layer) | Film Formation Temperature for Main Layer | a/b | $I(Pb^{4+})/I(Pb^{2+})$ |
|---|---|---|---|---|
| Comp. Ex. 1 | | 420° C. | 1.12 | 0.64 |
| Ex. 1 | 420° C. (150 nm) | 450° C. | 1.06 | 0.58 |
| Ex. 2 | 420° C. (150 nm) | 480° C. | 1.02 | 0.46 |
| Ex. 3 | 420° C. (150 nm) | 510° C. | 0.97 | 0.28 |

TABLE 2

| | $I(Pb^{4+})/I(Pb^{2+})$ | $d_{31}(+)$ (pm/V) | $d_{31}(-)$ (pm/V) | Average Life (billion) |
|---|---|---|---|---|
| Comp. Ex. 1 | 0.64 | 10 | 250 | 5 |
| Ex. 1 | 0.58 | 50 | 240 | 98 |
| Ex. 2 | 0.46 | 190 | 200 | 78 |
| Ex. 3 | 0.28 | 210 | 60 | 85 |

INDUSTRIAL APPLICABILITY

The piezoelectric material and the method for producing the piezoelectric material of the invention is preferably applicable to piezoelectric actuators provided in inkjet recording heads, magnetic read/write heads, MEMS (Micro Electro-Mechanical Systems) devices, micropumps, ultrasound probes, ultrasound motors, etc., and ferroelectric devices, such as ferroelectric memory.

What is claimed is:

1. A piezoelectric material comprising a perovskite oxide (P) (which may contain inevitable impurities) represented by the formula below:

$$Pb_a(Zr_x,Ti_y,M_{b-x-y})_bO_c \quad (P)$$

(wherein M represents one or two or more metal elements; wherein 0<x<b, 0<y<b, 0≦b-x-y; and wherein a molar ratio a:b:c is 1:1:3 as a standard; however, the molar ratio may be varied from the standard molar ratio within a range where a perovskite structure is obtained),
the piezoelectric material having a signal intensity ratio $I(Pb^{4+})/I(Pb^{2+})$ between $Pb^{4+}$ and $Pb^{2+}$ of more than 0 and less than 0.60 measured through XAFS (X-ray absorption fine-structure spectroscopy).

2. The piezoelectric material as claimed in claim 1 comprising a single-phase perovskite structure without a pyrochlore phase.

3. The piezoelectric material as claimed in claim 1, wherein x/(x+y) of the perovskite oxide (P) is not less than 0.40 and not more than 0.60.

4. The piezoelectric material as claimed in claim 1, wherein, in the perovskite oxide (P), 0<b-x-y and M comprises at least one element selected from the group consisting of V, Nb, Ta and Sb.

5. The piezoelectric material as claimed in claim 4, wherein the perovskite oxide (P) comprises Nb, and a Nb/(Zr+Ti+Nb) molar ratio is not less than 0.05 and not more than 0.25.

6. The piezoelectric material as claimed in claim 1 having a piezoelectric constant $d_{31}$ of 150 pm/V or more.

7. The piezoelectric material as claimed in claim 1 in the form of a film.

8. The piezoelectric material as claimed in claim 7, wherein the film has a thickness of not less than 500 nm and not more than 10 μm.

9. The piezoelectric material as claimed in claim 7 formed with a production method comprising a step (A) of carrying out film formation under conditions where a/b≧1.07, and a step (B) of carrying out film formation under conditions where a/b<1.07, which are carried out in this order.

10. The piezoelectric material as claimed in claim 9, wherein a film formation temperature in the step (A) of the production method is relatively lower than a film formation temperature in the step (B).

11. The piezoelectric material as claimed in claim 7 formed with a gas phase film formation process.

12. The piezoelectric material as claimed in claim 7 formed on any one of a silicon substrate, a silicon oxide substrate and a SOI substrate.

13. The piezoelectric material as claimed in claim 7 having an average life of 50 billion cycles or more under conditions of a temperature of 40° C. and a relative humidity of 80%, the average life measured under the following measurement conditions:

where a piezoelectric constant $d_{31}$ of the piezoelectric film is measured, the piezoelectric film being in the form of a piezoelectric device having a lower electrode formed on a side of the piezoelectric film nearer to the substrate and a number of upper electrodes formed on a side of the piezoelectric film opposite from the substrate; the upper electrodes have a layered structure of a 20 nm-thick Ti film and a 150 nm-thick Pt film formed in this order from the piezoelectric film side, and an area of each upper electrode is 0.6 mm²; the piezoelectric constant $d_{31}$ measured under a sinusoidal voltage with an offset of 10 V, an amplitude of ±10 V and a frequency of 1 kHz is defined as $d_{31}(+)$, and the piezoelectric constant $d_{31}$ measured under a sinusoidal voltage with an offset of −10 V, an amplitude of ±10V and a frequency of 1 kHz is defined as $d_{31}(-)$; when $d_{31}(+) \geqq d_{31}(-)$, a 100 kHz trapezoidal wave of −12.5 V±12.5 V is applied, and when $d_{31}(-) > d_{31}(+)$, a 100 kHz trapezoidal wave of −12.5 V±12.5 V is applied; in both cases, application of voltage is stopped every 1 billion cycles (i.e., 100 kHz×1 billion cycles=16.7 minutes), and tan δ for 1 V, 1 kHz is measured with a LCR meter; points at which the tan δ exceeds 0.1 are found as life values; and an average of the measured life values of randomly selected 20 upper electrodes among the number of upper electrodes on the piezoelectric film are calculated as the average life.

14. A method for producing a piezoelectric film comprising a perovskite oxide (P) (which may contain inevitable impurities) represented by the formula below:

  (P)

(wherein M represents one or two or more metal elements; wherein 0<x<b, 0<y<b, 0≦b-x-y; and wherein a molar ratio a:b:c is 1:1:3 as a standard; however, the molar ratio may be varied from the standard molar ratio within a range where a perovskite structure is obtained), the method comprising sequentially carrying out a step (A) of carrying out film formation under conditions where a/b≧1.07 and a step (B) of carrying out film formation under conditions where a/b<1.07, wherein the piezoelectric film has a single-phase perovskite structure without a pyrochlore phase, and has a signal intensity ratio $I(Pb^{4+})/I(Pb^{2+})$ between $Pb^{4+}$ and $Pb^{2+}$ of more than 0 and less than 0.60 measured through XAFS (X-ray absorption fine-structure spectroscopy).

15. The method for producing a piezoelectric film as claimed in claim 14, wherein a film formation temperature in the step (A) is relatively lower than a film formation temperature in the step (B).

16. A piezoelectric device comprising:
the piezoelectric material as claimed in claim 1; and
an electrode for applying an electric field to the piezoelectric material.

17. A liquid discharge device comprising:
the piezoelectric device as claimed in claim 16; and
a liquid discharge member disposed adjacent to the piezoelectric device, the liquid discharge member comprising a liquid reservoir for storing a liquid, and a liquid discharge port for discharging the liquid from the liquid reservoir to the outside in response to application of the electric field to the piezoelectric material.

* * * * *